(12) United States Patent
Aggarwal et al.

(10) Patent No.: US 7,144,808 B1
(45) Date of Patent: Dec. 5, 2006

(54) INTEGRATION FLOW TO PREVENT DELAMINATION FROM COPPER

(75) Inventors: Sanjeev Aggarwal, Plano, TX (US); Kelly J. Taylor, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 40 days.

(21) Appl. No.: 11/151,154

(22) Filed: Jun. 13, 2005

(51) Int. Cl.
*H01L 21/44* (2006.01)
*H01L 21/4763* (2006.01)

(52) U.S. Cl. .................. 438/675; 438/648; 438/643; 438/637; 438/638; 438/639; 438/652; 438/653; 438/654; 438/655; 438/656; 438/658; 438/659; 438/677; 438/678; 438/679; 438/680; 438/672; 438/668; 438/642; 438/644; 438/626; 438/627; 438/628; 438/629; 438/622; 438/623; 438/624; 438/631; 438/632; 438/633; 438/635; 257/E21.143

(58) Field of Classification Search ............. 438/675, 438/648, 643, 637–639, 652–656, 658–659, 438/677–687, 672, 668, 642–644, 626–629, 438/622–624, 631–633, 635

See application file for complete search history.

(56) References Cited

U.S. PATENT DOCUMENTS 6,130,156 A * 10/2000 Havemann et al. .......... 438/637
6,998,343 B1 * 2/2006 Sun et al. .................... 438/659

\* cited by examiner

*Primary Examiner*—Michael Lebentritt
*Assistant Examiner*—Mohsen Ahmadi
(74) *Attorney, Agent, or Firm*—Peter K. McLarty; W. James Brady, III; Frederick J. Telecky, Jr.

(57) ABSTRACT

The present invention provides, in one embodiment, method of forming a barrier layer 300 over a semiconductor substrate 110. The method comprises forming an opening 120 in an insulating layer 130 located over a substrate thereby uncovering an underlying copper layer 140. The method further comprises exposing the opening and the underlying copper layer to a plasma-free reducing atmosphere 200 in the presence of a thermal anneal. The also comprises depositing a barrier layer in the exposed opening and on the exposed underlying copper layer. Such methods and resulting conductive structures thereof may be advantageously used in methods to manufacture integrated circuits comprising copper interconnects.

17 Claims, 3 Drawing Sheets

INTEGRATION FLOW TO PREVENT DELAMINATION FROM COPPER

TECHNICAL FIELD OF THE INVENTION

The present invention is directed, in general, to manufacture of semiconductor devices and more specifically to a method for forming a copper interconnect structure.

BACKGROUND OF THE INVENTION

The push to sub-0.18 micron multilevel metallized interconnections, such as lines, via, and trenches, and the desire to produce faster semiconductor devices, has resulted in a shift toward the use of copper for making electrical interconnections in ultra-large scale integration circuits. The deposition of copper interconnects are not without difficulties, however. For example, when copper is etched, it tends to be redeposited elsewhere on the semiconductor device, or on the processing chamber. Copper atoms also readily diffuse into silicon-containing dielectric layers. The contamination by copper in unwanted locations can degrade or destroy the performance of active devices in integrated circuits.

One approach to reducing the problems with copper etching and diffusion to deposit an underlying barrier layer to block the migration of copper atoms into other components of the semiconductor. To facilitate the adhesion of copper to the diffusion barrier, a seed layer of copper is deposited over the diffusion barrier, followed by the deposition of a second thicker copper-conducting layer over the copper seed layer.

In a typical back-end-of-line integration flow an interlayer or intra-metal insulating layer is deposited on a semiconductor wafer and patterned to form lines, via, and trenches openings. The wafer is then transferred to one or more photoresist cleaning tools and then transferred to a tool for barrier and seed layer deposition. Typically, the diffusion barrier and copper seed layer are deposited on the wafer by a vacuum process, such as physical vapor deposition (PVD). The thick copper-conducting layer is deposited by a wet process, such as electrochemical deposition (ECD).

Because the wafer cleaning and barrier layer deposition are done on different tools, the wafer is exposed to the atmosphere for a period before being transferred to the deposition tool. Backlogs and mismatches in the machine times for wafer cleaning and seed layer deposition, or deposition tool break-down, can extend this period to several hours or even days. When processing of the wafer is resumed after extended periods barrier layer deposition is associated with delamination of the insulating layer or barrier layer from the wafer.

Accordingly, what is needed in the art is a method of forming a barrier layer that minimizes delamination and can accommodate a delay between post-patterning wafer cleaning and barrier layer deposition.

SUMMARY OF THE INVENTION

To address the above-discussed deficiencies of the prior art, the present invention provides a method of forming a barrier layer over a semiconductor substrate. The method comprises forming an opening in an insulating layer located over a substrate thereby uncovering an underlying copper layer. The opening and underlying copper layer are exposed to a plasma-free reducing atmosphere in the presence of a thermal anneal. A barrier layer is deposited in the exposed opening and on the exposed underlying copper layer.

In another embodiment, the present invention provides a method of manufacturing an integrated circuit. The method comprises forming an active device over a semiconductor wafer and forming a copper interconnect in an insulating layer located over the active device. Forming the copper interconnect comprises forming an opening to uncover an underlying copper layer, exposing the opening and underlying copper layer as described above and depositing a barrier layer in the exposed opening and on the exposed underlying copper layer. Forming the copper interconnect also comprises forming a copper seed layer on the barrier layer and electrochemically depositing a second copper layer on the copper seed layer. The copper interconnect is connected to the active device to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying figures. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

As part of the present invention, it was discovered that molecular contaminants from the atmosphere, or residual water or hydrocarbons from wafer cleaning, can interact with the insulating layer and with an underlying copper layer uncovered by forming openings in the insulating layer. These molecular contaminants can absorb into the insulating layer during extended delay periods between wafer cleaning and barrier deposition. Molecular contaminants can also interact with the underlying copper layer during extended delays causing oxidation and hydroxylation of the copper. This interaction was determined to be especially strong in non-active areas of the wafer, that is, areas where there are no active devices such as scribe regions. It was further discovered that such interactions in the scribe region often are the root cause of delamination.

It is believed that the volume expansion associated with the formation of copper oxides or hydroxides on the underlying copper layer weaken the internal adhesion of multi-layered insulating layers. For instance adhesion can be weakened between a hardmask layer comprising a silicon nitride layer and and organo-silicate glass layer. It is also believed that the rapid heating of the substrate during a degas step barrier layer deposition causes molecular contaminants absorbed in the insulating layer, such as between the silicon nitride layer and organo-silicate glass layer, to release and evaporate. The vaporization of the molecular contaminants during their rapid heating weakens the internal adhesion of multi-layered insulating layers and adhesion of the insulating layer with the underlying copper layer.

The present invention recognizes, for the first time, the advantages of exposing the opening and underlying copper layer of a semiconductor substrate to a plasma-free reducing atmosphere and thermal anneal. Although discussed in the context of forming a barrier layer in copper interconnects, the present invention can be applied to any situation where it is desirable to protect against the delamination of insulating and barrier layers from a copper surface.

Figure 2:
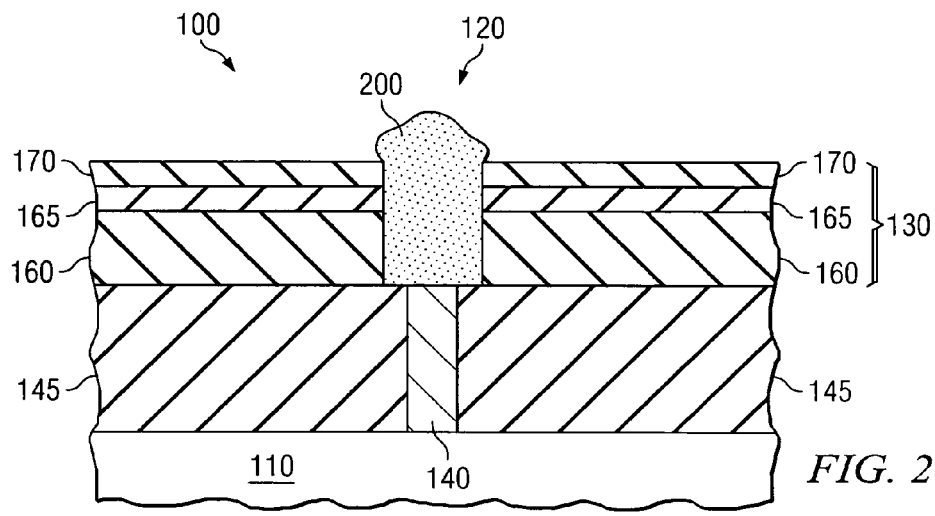
Figure 3:
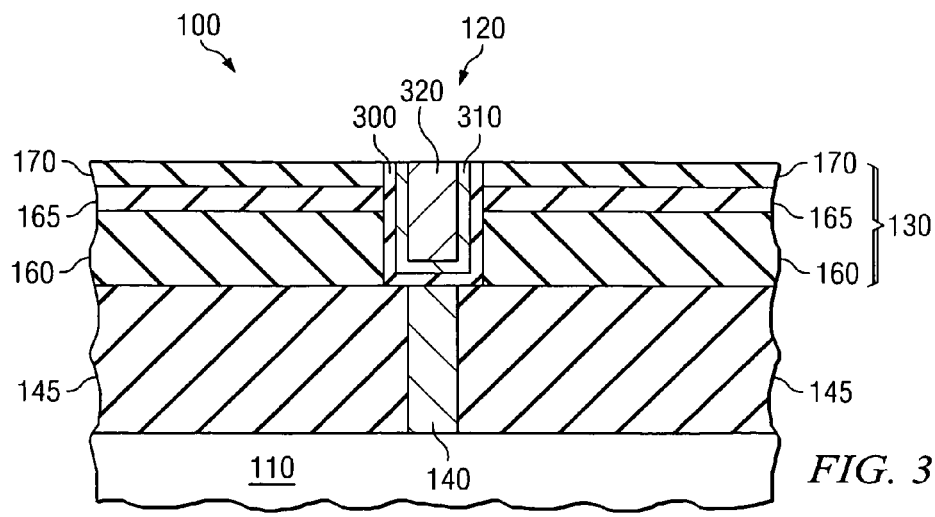

One embodiment of the present invention is a method of forming a barrier layer. Illustrated in FIGS. 1 to 3, are cross-sectional views of selected steps in the method to form a barrier layer over a semiconductor substrate according to the principles of the present invention.

Figure 1:
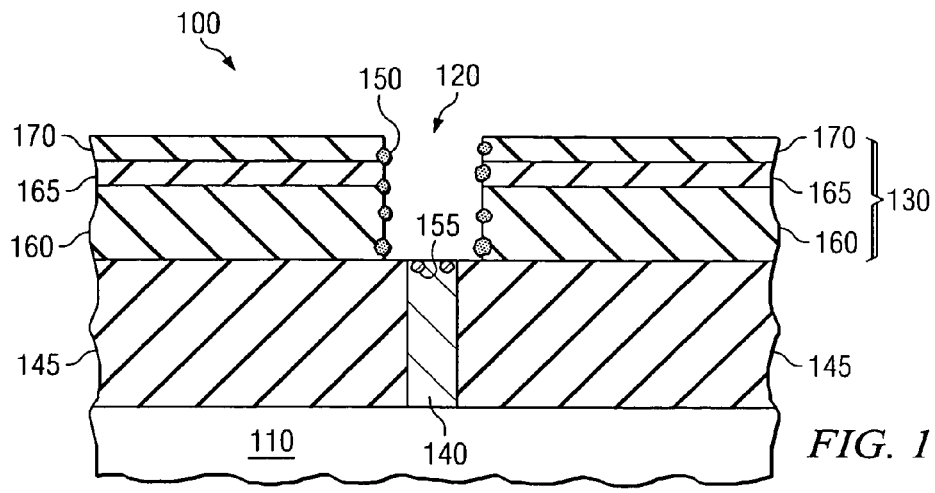
FIGS. 1 to 3 illustrate cross-sectional views of selected steps in a method of forming an exemplary barrier layer over a semiconductor substrate according to the principles of the present invention.

Turning first to FIG. 1, illustrated is a partially completed copper interconnect 100 located over a semiconductor substrate 110 after forming an opening 120 in an insulating layer 130 located over the substrate 110. The substrate 110 can comprise any material used in the manufacture of integrated circuits, such as a silicon wafer. In some preferred embodiments, the insulating layer 130 comprises an interlayer or intra-metal dielectric material. The opening 120 can comprise any conventional interconnect 100 including lines, vias or trenches. One of ordinary skill in the art would be familiar with the techniques for forming the opening 120. For example, conventional lithographic and dry plasma etching procedures can be used to define and form the opening 120 in the insulating layer 130.

As further illustrated in FIG. 1 forming the opening 120 uncovers an underlying copper layer 140 located in an underlying insulating layer 145. The underlying copper layer 140 comprises any of the above-mentioned types of conventional types of interconnects. Molecular contaminants 150 like oxygen and water that are present in the atmosphere above the substrate 110 can react with the underlying copper layer 140 to form copper oxide or copper hydroxide deposits 155. The formation of copper oxide and hydroxide deposits 155 is exacerbated by high humidity environments (e.g., about 60 percent humidity) favored in certain barrier layer fabrication processes.

As also illustrated in FIG. 1, molecular contaminants 150, such as water or hydrocarbons, can absorb into the insulating layer 130. In some embodiments such as when the insulating layer 130 comprises a porous low-k dielectric material the absorption of molecular contaminants 150 can be substantial. This is the case when the insulating layer 130 comprises one or more of an organo-silicate glass (OSG) layer 160, a silicon nitride layer 165, and a tetraethyl orthosilicate-deposited silicon oxide layer 170.

As noted above the molecular contaminants 150 can come from the atmosphere above the substrate 110. Alternatively, the molecular contaminants 150 can come from cleaning residue. In some preferred embodiments, after forming the opening 120, but before depositing the barrier layer, photoresist is removed from the substrate 110 by one or both of a plasma ash and wet cleaning. In some preferred embodiments plasma ashing comprises exposing the substrate 110 to a plasma in the presence of oxygen and carbon tetrafluoride at 200° C., to convert the photoresist into volatile carbon oxides and water vapor. The molecular contaminants 150 can comprise residual volatile carbon oxides and water vapor that are not removed by a vacuum system of a plasma ashing tool.

In other preferred embodiments, wet cleaning comprises washing the substrate 110 with an aqueous or organic solvent, and more preferably a fluoride-containing solvent, and more preferably, a pH buffered fluoride-stripper such as ACT® NE-14 (Ashland Specialty Chemical Company, Dublin, Ohio). The molecular contaminants 150 can comprise residual solvent remaining on the substrate 110 after washing with the solvent.

With continued reference to FIG. 1, FIG. 2 shows the partially constructed copper interconnect 100 while exposing the opening 120 and the underlying copper layer 140 to a plasma-free reducing atmosphere 200 in the presence of a thermal anneal. The term reducing atmosphere as used herein refers to a gas or combination of gases capable of reducing copper oxide to copper metal. While not limiting the scope of the invention by theory, it is believed that the reducing atmosphere 200 and thermal anneal cooperate to reduce the incidence of delamination during barrier layer 110 deposition.

The reducing atmosphere 200 converts oxidized and hydroxylated copper deposits 155 (FIG. 1) back into elemental copper thereby improving adhesion between the underlying copper layer 140 and the insulating layer 130. Concurrent thermal annealing accelerates the rate of reducing copper oxide and copper hydroxide deposits 155 back to copper metal. Additionally, thermal annealing in the presence of a flow of the reducing atmosphere 200 facilitates desorption and removal of molecular contaminants 150 (FIG. 1) from the insulating layer. For instance, the rate of removal of molecular contaminants 150 in the presence of a flow of the reducing atmosphere 200 is faster than in the presence of a vacuum. Removing molecular contaminants 150 from the insulating layer 130 in turn improves adhesion between multiple layers 160, 165, 170 in the insulating layer 130 and between the underlying copper layer 140 and the insulating layer 130. Removing molecular contaminants 150 such as water from the insulating layer 130 also beneficially eliminates molecular contaminants 150 that promote the formation of copper oxide or hydroxide deposits 155 on the underlying copper layer 140.

It is important that the reducing atmosphere 200 and thermal anneal be done in a plasma-free environment. A plasma densifies the insulating layer 130 thereby undesirably increasing the insulating layer's 130 dielectric constant. An increase in the dielectric constant of the insulating layer 130 is undesirable because this increases the RC delay, the signal propagation time between active devices.

Some embodiments of the plasma-free reducing atmosphere 200 comprise a reducing gas comprising hydrogen ($H_2$), carbon monoxide or combinations thereof. It is desirable to keep the hydrogen gas content of the plasma-free reducing atmosphere 200 below about 5 percent by volume to avoid explosion hazards. Certain preferred embodiments of the plasma-free reducing atmosphere 200 comprise hydrogen and balance an inert gas. The inert gas can comprise noble gases, nitrogen or other non-reactive, non-flammable gases well known to those skilled in the art. Some preferred plasma-free reducing atmospheres 200 comprise from 1 to 5 percent hydrogen gas and balance a noble gas. Other preferred plasma-free reducing atmospheres 200 comprise about 4 percent hydrogen gas and balance argon.

In certain advantageous embodiments the thermal anneal comprises holding a temperature of the substrate 110 in a temperature range of about 150° C. to about 300° C. for about 3 to about 6 minutes. More preferably the substrate 110 is held in a temperature range from about 150° C. to about 200° C. In other preferred embodiments the thermal anneal comprises increasing a temperature of the substrate 110 at a rate of less than about 5° C. per second. A slow rate of temperature increase is advantageous because this facilitates the removal of the molecular contaminants 150 from the insulating layer 130 without damaging the insulating layer. As noted above as part of the present invention it was discovered that rapid heating (e.g., heating at a rate of greater than about 8° C. per second) to remove molecular contaminants 150 weakens the internal adhesion of multi-layered insulating layers 160, 165, 170 and further weakens adhesion of the insulating layer 130 with the underlying copper layer 170.

In some preferred embodiments exposure to the reducing atmosphere 200 and thermal anneal is performed in a chamber comprising the reducing atmosphere at a pressure of about 2 Torr. The exposure to the reducing atmosphere 200 and thermal anneal can be accomplished in a separate chamber or in one of the same chambers already used in a barrier layer process flow. These instruments are omitted from FIG. 2 for clarity. In some cases, for instance, exposure to the reducing atmosphere 200 and thermal anneal are performed in the same chamber as used for plasma ashing. In other cases exposure is performed in the same physical vapor deposition cluster tool as used for barrier layer deposition. Exposure in the physical vapor deposition cluster tool is preferred in some cases because this minimizes the delay time between exposure to the reducing atmosphere 200 and thermal anneal and barrier layer deposition.

Referring now to FIG. 3, while maintaining reference to FIGS. 1–2, FIG. 3 illustrates the copper interconnect 100 after depositing a barrier layer 300 in the opening 120 and on the underlying copper layer 140. The barrier layer 300 is deposited after exposure to the plasma-free reducing atmosphere 200 and thermal anneal. It is preferable to deposit the barrier layer within a predefined period after exposure that is 72 hours or less, and more preferably 36 hours or less. If a delay period between exposure and the barrier layer deposition is greater than about 36 to about 72 hours then there is a risk of corroding underlying copper layer 140 or of moisture absorbing into the insulating layer 130, such as between the organo-silicate glass (OSG) layer 160 and a silicon nitride layer 165. In such cases it is desirable to repeat the exposure to the plasma-free reducing atmosphere 200 and thermal anneal before depositing the barrier layer 300. In some cases for example exposure to the plasma-free reducing atmosphere 200 is repeated if a delay period between the exposing and depositing the barrier layer 300 is greater than about 36 hours. The opening 120 can be exposed to the plasma-free reducing atmosphere 200 and thermal anneal several times, but more preferably less than four times.

In certain preferred embodiments the barrier layer 300 comprises tantalum, tantalum nitride or combinations thereof. Preferably, the barrier layer 300 deposition is carried out in a conventional copper seed layer deposition tool such as a chemical vapor deposition (CVD), atomic layer deposition (ALD), or more preferably, physical vapor deposition (PVD) tool. These instruments are omitted from FIG. 3 for clarity. In some preferred embodiments physical vapor deposition of the barrier layer 300 comprises striking a tantalum target with positively charged argon ions in the presence of nitrogen gas.

FIG. 3 also depicts the copper interconnect 100 after forming a copper seed layer 310 on the barrier layer 300 and electrochemically depositing a second copper layer 320 on the copper seed layer 310. The copper interconnect 100 is shown after planarizing the substrate 110 to remove portions of the barrier layer 300, copper seed layer 310 and second copper layer 320 lying outside the opening 120. Planarizing can be achieved by any conventional process such as chemical mechanical polishing.

Any conventional procedures can be used for depositing the copper seed layer 310 and the second copper layer 320. Copper seed layer 310 deposition is preferably carried out in the same PVD tool as used for barrier layer 300 deposition. Preferably electrochemical deposition is carried out in a tool comprising a bath for electrochemically depositing copper. Conventional materials can be used in the electrochemical deposition bath, such as sulphuric acid and copper sulfate in water.

Figure 4:
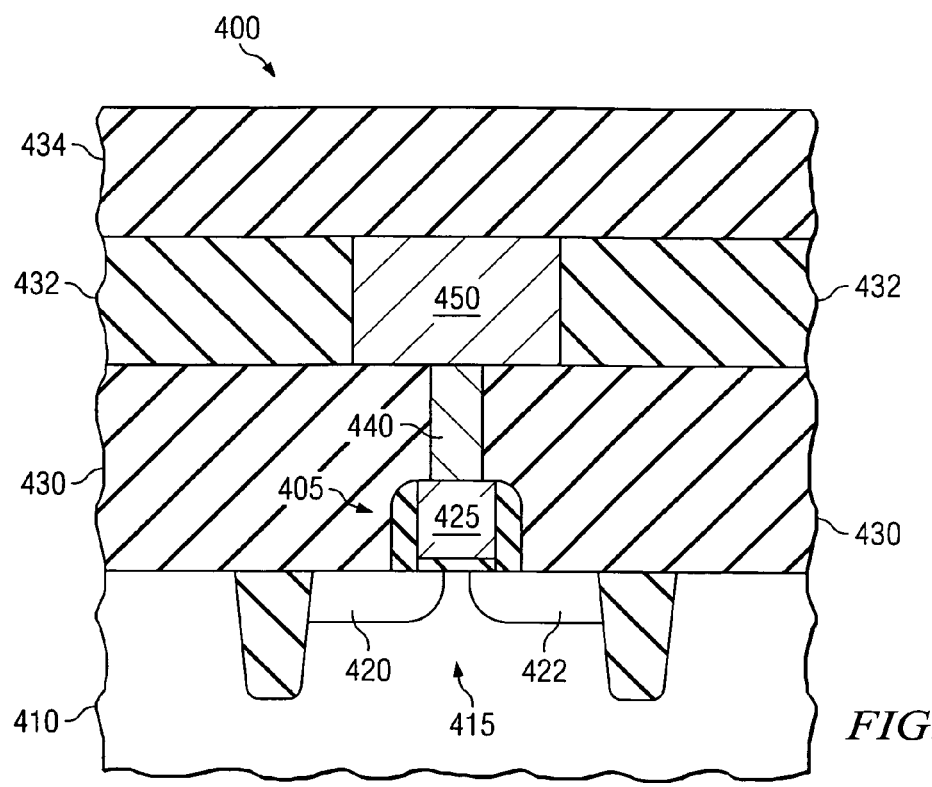
FIGS. 4 to 6 illustrate sectional views of selected steps in a method of manufacturing an exemplary integrated circuit according to the principles of the present invention.
Figure 5:
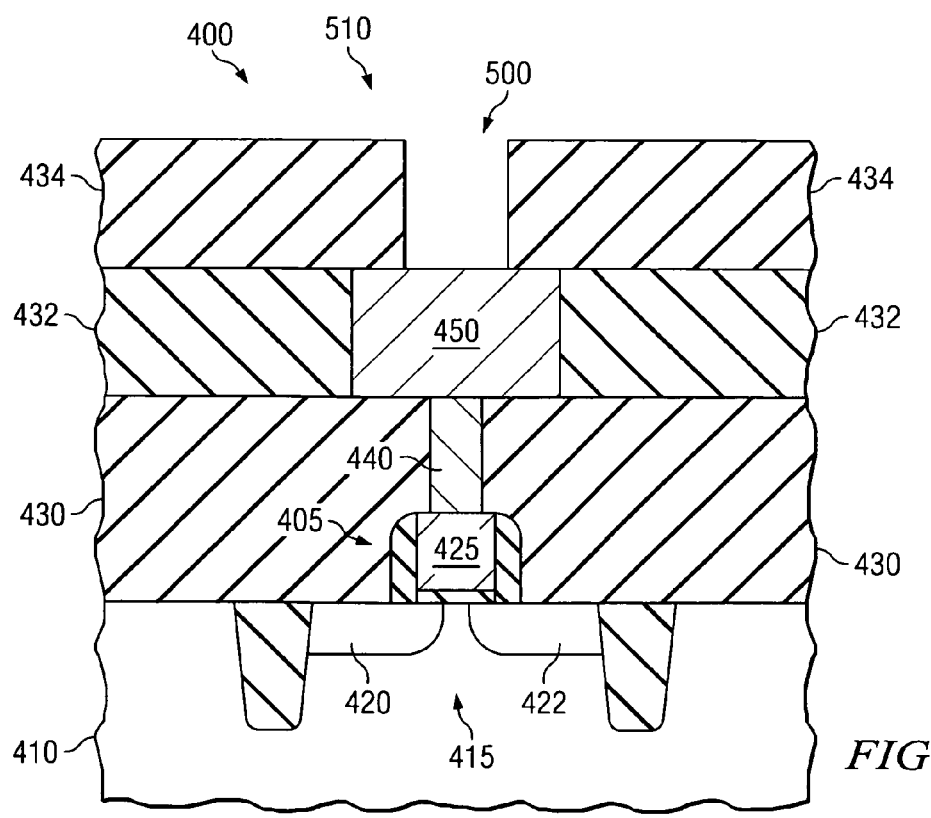
Figure 6:
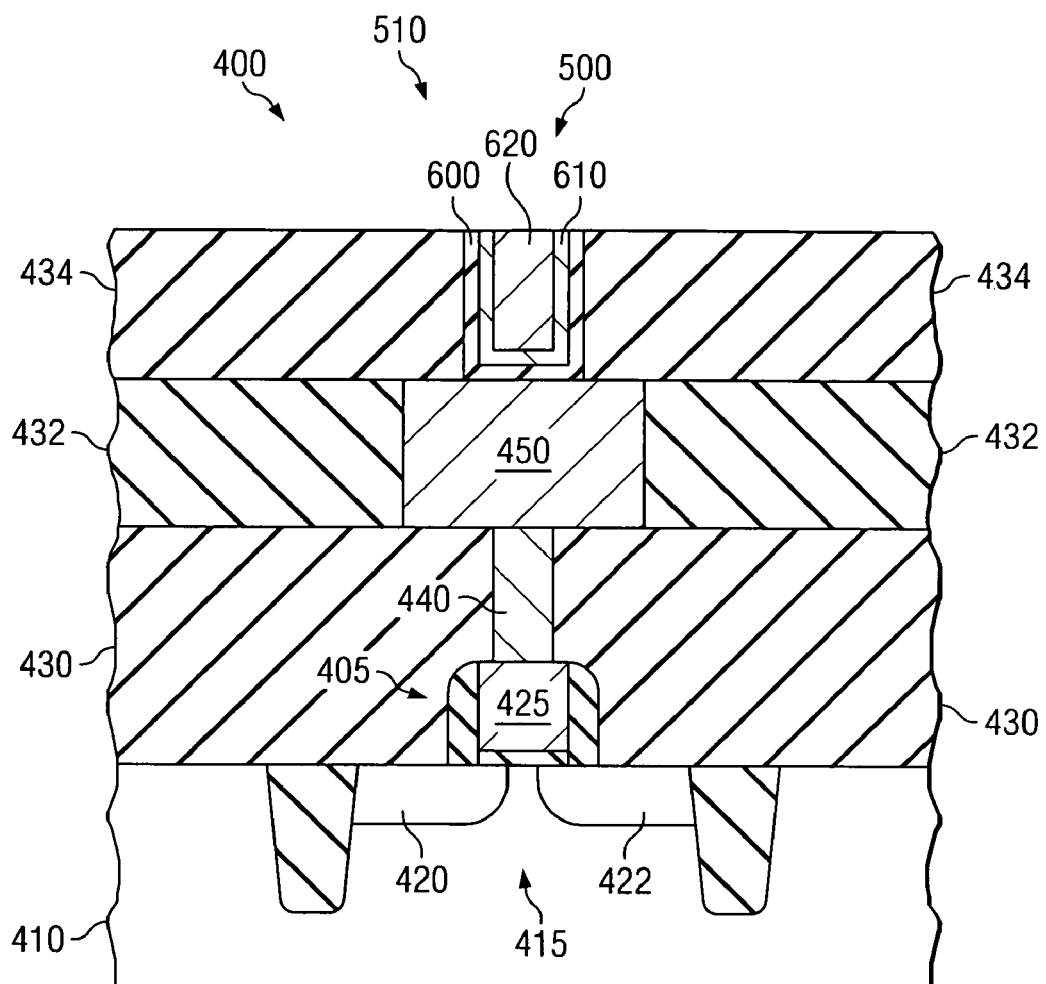

Another aspect of the present invention is a method of manufacturing an integrated circuit. FIGS. 4–6 illustrate an exemplary method of manufacturing an integrated circuit 400 at selected stages of fabrication. Any of the above-described embodiments may be applied to the method of manufacturing the integrated circuit 400.

Turning to FIG. 4, illustrated the partially completed integrated circuit 400 after forming an active device 405 over a semiconductor substrate 410. Of course, any number of active devices comprising conventional transistors, such as a metal-oxide-silicon (MOS) transistor, can be formed over or in the semiconductor substrate 410. The active device 405 can include conventional integrated circuit components, such as MOS components like a doped region 415, source/drain regions, 420, 422 and gate structure 425.

FIG. 4 also depicts the integrated circuit 400 after forming one or more insulating layers 430, 432, 434 over the active device 405. The insulating layers 430, 432, 434 comprise any conventional materials including OSG, silicon nitride, silicon oxide or multilayered combinations thereof. One skilled in the art would be familiar with conventional methods for forming the insulating layers 430, 432, 434 such as CVD or spin-on methodologies.

FIG. 4 further depicts the integrated circuit 400 after forming one or more via 440 through an insulation layer 430 and contacting the active device 405. Some preferred embodiments of the via 440 comprise tungsten, titanium or combinations thereof. The via 440 can be formed using convention techniques such and CVD or PVD. Other materials and methods of forming the via 440 would be readily apparent to one skilled in the art.

Also shown in FIG. 4 is a copper layer 450 formed in one of the insulating layers 432 and in contact with the via 440. The copper layer 450 comprises any conventional interconnecting structure such as a line, via, or trench. The copper layer 450 can be formed by any of the above-described copper deposition processes including PVD and ECD or other conventional process.

Turning now to FIG. 5, while maintaining reference to FIG. 4, shown is the integrated circuit 400 after forming an opening 500 in one of the insulating layers 434. As illustrated in FIG. 5, forming the opening 500 uncovers the underlying copper layer 450. The opening 500 can be formed as part of a single damascene or dual damascene process using conventional lithographic and etching techniques. The opening 500 is formed as part of forming a copper interconnect 510 in one or more insulating layer 434. Like the copper layer 450, the copper interconnect 510 comprises any conventional interconnect structure including lines, vias and trenches.

With continuing reference to FIGS. 4–5, FIG. 6 illustrates the integrated circuit 400 after exposing the opening 500 and the underlying copper layer 450 to a plasma-free reducing atmosphere in the presence of a thermal anneal. Any of the above-described reducing atmospheres and thermal anneals can be applied. FIG. 6 also depicts the integrated circuit 400 after depositing a barrier layer 600 in the exposed opening 500 and on the exposed underlying copper layer 450.

FIG. 6 additionally depicts forming a copper seed layer 610 on the barrier layer 600 and electrochemically depositing a second copper layer 620 on the copper seed layer 610. The copper interconnect 510 is thereby connected with the active device 405. One of ordinary skill would understand that the method may further be extended to form any number of additional interconnects located over the copper interconnect 510 240, and would understand how to connect those interconnects with the active device 405 or other active devices to form an operative integrated circuit 400.

Although the present invention has been described in detail, those skilled in the art should understand that they can make various changes, substitutions and alterations herein without departing from the scope of the invention in its broadest form.

What is claimed is:

1. A method of forming a barrier layer over a semiconductor substrate, comprising:
   forming an opening in an insulating layer located over a substrate thereby uncovering an underlying copper layer;
   exposing said opening and said underlying copper layer to a plasma-free reducing atmosphere comprising hydrogen and balance an inert gas in the presence of a thermal anneal wherein said thermal anneal comprises holding a temperature of said substrate in a temperature range of about 150° C. to about 300° C. for about 3 to about 6 minutes; and
   depositing a barrier layer in said exposed opening and on said exposed underlying copper layer.

2. The method as recited in claim 1, wherein said plasma-free reducing atmosphere comprises a reducing gas comprising hydrogen, carbon monoxide or combinations thereof.

3. The method as recited in claim 1, said plasma-free reducing atmosphere comprises hydrogen and balance an inert gas.

4. The method as recited in claim 1, wherein said plasma-free reducing atmosphere comprises from about 1 to about 5 percent hydrogen gas and balance a noble gas.

5. The method as recited in claim 1, wherein said plasma-free reducing atmosphere comprises about 4 percent hydrogen gas and said inert gas comprises argon.

6. The method as recited in claim 1, wherein said thermal anneal comprises increasing a temperature of said substrate at a rate of less than about 5° C. per second.

7. The method as recited in claim 1, wherein said exposing is performed in a chamber comprising said reducing atmosphere at a pressure of about 2 Torr.

8. The method as recited in claim 1, wherein said exposing is repeated if a delay period between said exposing and said depositing is greater than about 36 hours.

9. The method as recited in claim 1, wherein said insulating layer comprises one or more layers of organo-silicate glass (OSG), silicon nitride, tetraethyl orthosilicate (TEOS) or combinations thereof.

10. The method as recited in claim 1, wherein said barrier layer comprises tantalum, tantalum nitride or combinations thereof.

11. The method as recited in claim 1, further comprising wet cleaning said opening before said exposing.

12. The method as recited in claim 1, further comprising forming a copper seed layer on said barrier layer and electrochemically depositing a second copper layer on said copper seed layer.

13. A method of manufacturing an integrated circuit comprising:
    forming an active device over a semiconductor wafer;
    forming a copper interconnect in an insulating layer located over said active device comprising:
      forming an opening in said insulating layer thereby uncovering an underlying copper layer;
      exposing said opening and said underlying copper layer to a plasma-free reducing atmosphere comprising hydrogen and balance an inert gas in the presence of a thermal anneal wherein said thermal anneal comprises holding a temperature of said substrate in a range of about 150° C. to about 300° C. for about 3 to about 6 minutes;
      depositing a barrier layer in said exposed opening and on said exposed underlying copper layer;
      forming a copper seed layer on said barrier layer; and
      electrochemically depositing a second copper layer on said copper seed layer; and
    connecting said copper interconnect with said active device to form an operative integrated circuit.

14. The method as recited in claim 13, wherein said plasma-free reducing atmosphere comprises a reducing gas comprising hydrogen, carbon monoxide or combinations thereof.

15. The method as recited in claim 13, wherein said plasma-free reducing atmosphere comprises from 1 to 5 percent hydrogen gas and balance a noble gas.

16. The method as recited in claim 13, wherein said thermal anneal comprises increasing a temperature of said substrate at a rate of less than about 5° C. per second.

17. The method as recited in claim 13, further comprising wet cleaning said opening before said exposing.

* * * * *